(12) United States Patent
Sonogi (10) Patent No.: US 11,877,107 B2
(45) Date of Patent: Jan. 16, 2024

(54) MICROPHONE DEVICE

(71) Applicant: Yamaha Corporation, Hamamatsu (JP)

(72) Inventor: Akihiro Sonogi, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 17/170,157

(22) Filed: Feb. 8, 2021

(65) Prior Publication Data

US 2021/0250684 A1 Aug. 12, 2021

(30) Foreign Application Priority Data

Feb. 10, 2020 (JP) ................. 2020-020765

(51) Int. Cl.
| | | |
|---|---|---|
| *H04R 3/00* | (2006.01) | |
| *G10L 21/0216* | (2013.01) | |
| *H04R 1/08* | (2006.01) | |
| *B81B 7/00* | (2006.01) | |
| *H04N 7/18* | (2006.01) | |
| *H04R 19/04* | (2006.01) | |
| *H04R 1/40* | (2006.01) | |

(52) U.S. Cl.
CPC .......... *H04R 3/005* (2013.01); *G10L 21/0216* (2013.01); *H04R 1/086* (2013.01); *B81B 7/0061* (2013.01); *G10L 2021/02166* (2013.01); *H04N 7/188* (2013.01); *H04R 1/406* (2013.01); *H04R 19/04* (2013.01)

(58) Field of Classification Search
CPC ........ H04R 3/005; H04R 1/086; H04R 19/04; H04R 1/406; G10L 21/0216; G10L 2021/02166; B81B 7/0061; H04N 7/188
See application file for complete search history.

(56) References Cited

U.S. PATENT DOCUMENTS

| | | | | |
|---|---|---|---|---|
| 8,213,634 | B1 * | 7/2012 | Daniel | H04R 3/005 381/91 |
| 8,215,634 | B2 * | 7/2012 | Nireki | B65H 29/46 271/147 |
| 2003/0198362 | A1 * | 10/2003 | Bodley | H04R 1/406 381/361 |

(Continued)

FOREIGN PATENT DOCUMENTS

| | | | |
|---|---|---|---|
| CN | 207219017 U | * | 4/2018 |
| JP | 2018-515028 A | | 6/2018 |

(Continued)

OTHER PUBLICATIONS

Extended European Search Report issued in European Application No. 21155719.4 dated Jun. 11, 2021 (nine (9) pages).

(Continued)

*Primary Examiner* — Carolyn R Edwards
*Assistant Examiner* — Kuassi A Ganmavo
(74) *Attorney, Agent, or Firm* — Crowell & Moring LLP (57) ABSTRACT

A microphone device includes a substrate, a plurality of microphones, a front panel, and a dustproof member. The plurality of microphones are arranged on the substrate. The front panel is configured to cover the substrate. The dustproof member is arranged so as to overlap the plurality of microphones in a plan view from a front panel side, and provided on a member different from the front panel.

10 Claims, 7 Drawing Sheets

(56) References Cited

U.S. PATENT DOCUMENTS

| | | | |
|---|---|---|---|
| 2006/0269089 A1* | 11/2006 | Gieson | H04R 1/083 381/361 |
| 2007/0019829 A1* | 1/2007 | Yonehara | H04R 19/04 381/174 |
| 2008/0013770 A1* | 1/2008 | Wu | H04R 1/406 381/357 |
| 2009/0052715 A1* | 2/2009 | Zhang | H04R 1/406 381/365 |
| 2010/0246877 A1* | 9/2010 | Wang | B81B 7/0061 381/361 |
| 2011/0019857 A1* | 1/2011 | Matsui | H04R 1/406 381/356 |
| 2011/0170728 A1 | 7/2011 | Chen | |
| 2014/0161295 A1* | 6/2014 | Huang | H04R 1/406 381/357 |
| 2014/0294217 A1* | 10/2014 | Yamaguchi | H04M 1/035 381/334 |
| 2016/0323668 A1* | 11/2016 | Abraham | H04R 1/02 |
| 2017/0041692 A1* | 2/2017 | Watson | H04R 19/04 |
| 2017/0105066 A1* | 4/2017 | McLaughlin | H04R 1/406 |
| 2017/0134850 A1* | 5/2017 | Graham | H04R 3/005 |
| 2017/0264999 A1* | 9/2017 | Fukuda | H04N 23/51 |
| 2018/0338205 A1 | 11/2018 | Abraham et al. | |
| 2020/0068297 A1* | 2/2020 | Rollow, IV | H04R 1/406 |
| 2020/0169799 A1* | 5/2020 | Schuler | H04R 1/04 |

FOREIGN PATENT DOCUMENTS

| WO | WO 2010/005142 A1 | 1/2010 |
|---|---|---|
| WO | WO 2016/176429 A2 | 11/2016 |

OTHER PUBLICATIONS

European Office Action issued in European Application No. 21 155 719.4 dated Mar. 20, 2023 (six (6) pages).

Japanese-language Office Action issued in Japanese Application No. 2020-020765 dated Oct. 3, 2023 with English translation (7 pages).

* cited by examiner

MICROPHONE DEVICE

CROSS REFERENCE TO RELATED APPLICATIONS

This application claims priority to Japanese Patent Application No. 2020-020765 filed on Feb. 10, 2020, the entire contents of which are incorporated herein by reference.

BACKGROUND

Technical Field

The present disclosure relates to a microphone device including a plurality of microphones and a front panel configured to cover the plurality of microphones.

An array microphone system include a plurality of microphones, a screen and a protection film. The plurality of microphones are mounted on a substrate.

The screen is arranged on a front surface side of the substrate. The screen is a surface exposed to outside when the array microphone system is installed.

The protection film protects the plurality of microphones and the substrate from outside, and is attached to a back surface of the screen In the previously discussed array microphone system, when the screen is repainted, the protection film needs to be removed from the screen, and after repainting, the protection film needs to be attached to the screen again. Therefore, work of repainting the screen is complicated.

On the other hand, if the protection film is not arranged, protection performance of the plurality of microphones will be reduced.

SUMMARY

This disclosure provides a microphone device capable of easily repainting a front panel such as a screen without reducing protection performance of a plurality of microphones.

An inventive a microphone device includes a substrate, a plurality of microphones arranged on the substrate, a front panel configured to cover the substrate, and a dustproof member arranged so as to overlap the plurality of microphones in a plan view from a front panel side, and provided on a member different from the front panel.

The inventive microphone device can easily repaint the front panel such as a screen while protecting the plurality of microphones. Other objects, advantages and novel features of the embodiments of the present invention will become apparent from the following detailed description of one or more preferred embodiments when considered in conjunction with the accompanying drawings, in which:

DETAILED DESCRIPTION

Figure 1:
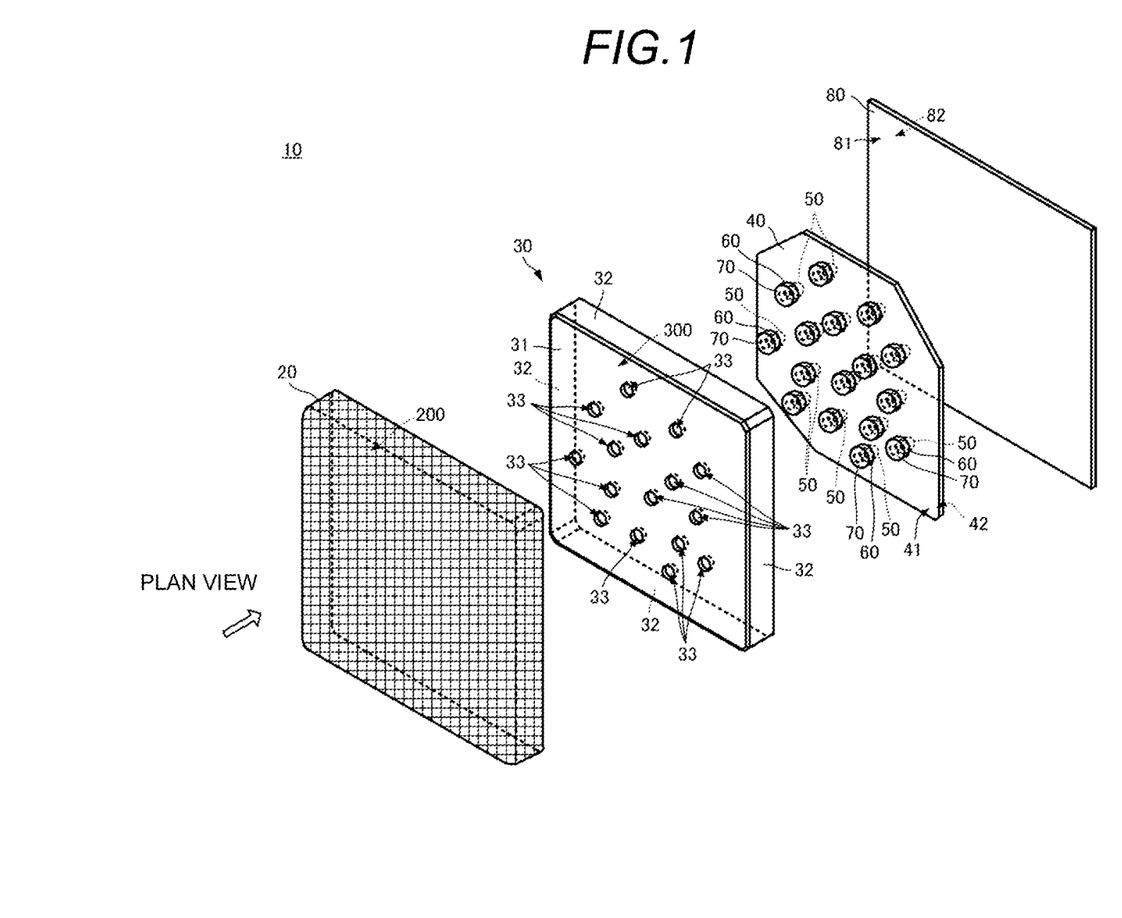
FIG. 1 is an exploded perspective view of a microphone device.
Figure 2:
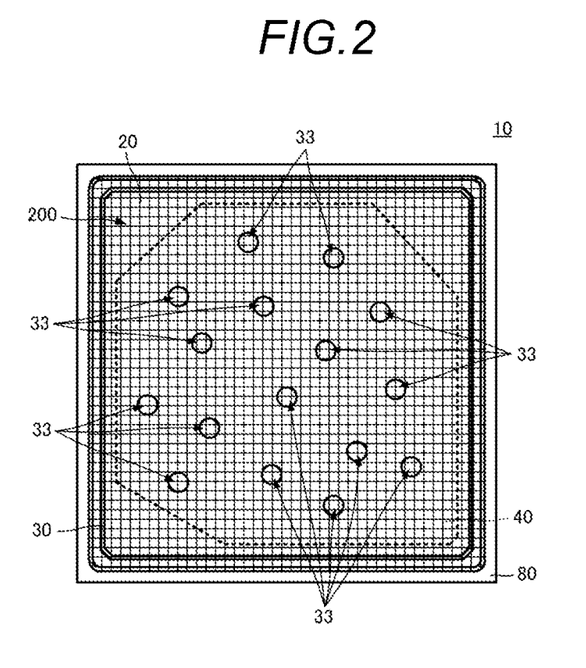
FIG. 2 is a plan view of the microphone device.
Figure 3A:
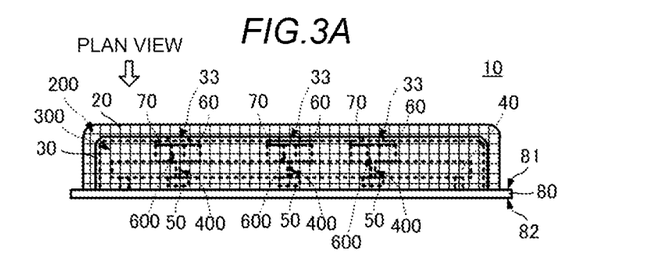
FIG. 3A is a side view of the microphone device.
Figure 3B:
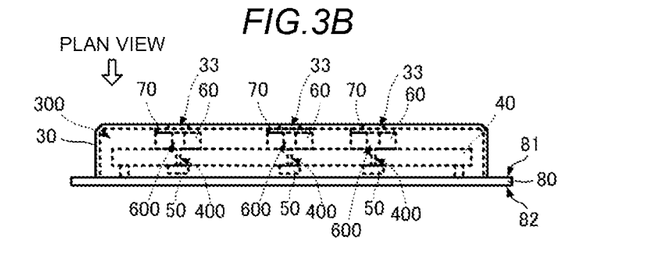
FIG. 3B is a side view of the microphone device without a front panel.
Figure 3C:
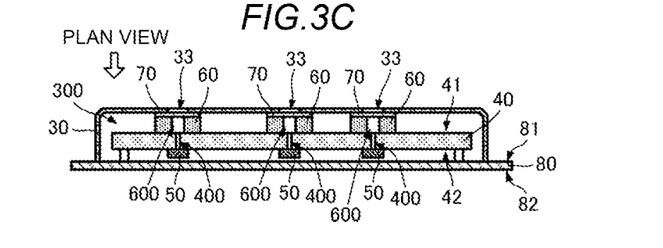
FIG. 3C is a side sectional view of the microphone device without the front panel.
Figure 4:
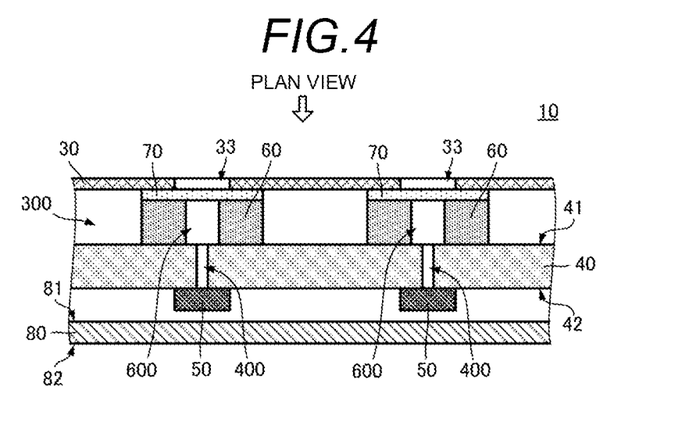
FIG. 4 is an enlarged side sectional view of a part of the microphone device.

FIG. 1 is an exploded perspective view of a microphone device. FIG. 2 is a plan view of the microphone device. FIG. 3A is a side view of the microphone device, FIG. 3B is a side view of the microphone device without a front panel, and FIG. 3C is a side sectional view of the microphone device without the front panel. FIG. 4 is an enlarged side sectional view of a part of the microphone device. In FIG. 1, some reference numerals are omitted for the sake of clarity of illustration. In FIGS. 3A, 3B and 3C, an internal structure of the microphone device is schematically described for the sake of clarity of illustration.

As shown in FIGS. 1, 2, 3A, 3B and 3C, a microphone device 10 includes a front panel 20, a protection member 30, a substrate 40, a plurality of microphones 50, a plurality of sound insulation walls 60, a plurality of dustproof members 70, and a rear panel 80.

The front panel 20 has a box shape having a recess 200. The front panel 20 has, for example, a mesh structure. The front panel 20 is not limited to the mesh structure as long as the front panel 20 has a structure that allows sound to pass therethrough (a structure having sound permeability).

The protection member 30 has a box shape having a recess 300. The protection member 30 is formed of, for example, a plate material having rigidity such as a metal plate. More specifically, the protection member 30 includes a main plate 31 and a plurality of side plates 32. The plurality of side plates 32 are arranged along an outer edge of the main plate 31 and are connected to the main plate 31. At this time, the plurality of side plates 32 are connected so as to be orthogonal to the main plate 31. Accordingly, the protection member 30 has the recess 300. The main plate 31 has a plurality of holes 33. The plurality of holes 33 penetrate the main plate 31 in a thickness direction.

The substrate 40 includes a first surface 41 and a second surface 42 that face each other. The substrate 40 includes, for example, a base material of an insulating resin and a conductor pattern formed on the base material. As shown in FIGS. 3A, 3B, 3C and 4, the substrate 40 has a plurality of holes 400. The plurality of holes 400 penetrate the substrate 40 in the thickness direction.

The plurality of microphones 50 are, for example, MEMS microphones. The plurality of microphones 50 each include, for example, a housing having a sound receiving surface, and the sound receiving surface has a sound receiving hole.

Figure 5A:
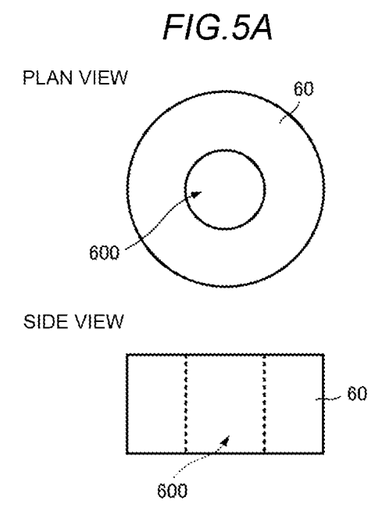
FIG. 5A is a plan view and a side view of a sound insulation wall.

FIG. 5A is a plan view and a side view of the sound insulation wall. As shown in FIG. 5A, the sound insulation wall 60 has a cylindrical shape and has a through hole 600. A surface where the through hole 600 is open is an end surface of the sound insulation wall 60. The sound insulation wall 60 is formed of an elastic member, and is formed of, for example, urethane foam, rubber, elastic resin or the like. The cylindrical wall has a predetermined thickness.

Accordingly, the sound insulation wall 60 prevents sound leakage in a direction orthogonal to an axial direction of the cylindrical shape. That is, the sound insulation wall 60 prevents sound propagating in an inner space from leaking to an outer space through the cylindrical wall. On the contrary, the sound insulation wall 60 prevents sound in the outer space from leaking to the inner space through the cylindrical wall. The sound insulation wall 60 is not limited to the cylindrical shape, and may have a tubular shape. That is, the sound insulation wall 60 may be a polygonal tube having a base material such as a triangular prism or a quadrangular prism.

Figure 5B:
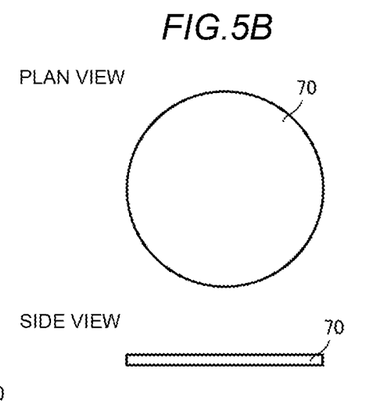
FIG. 5B is a plan view and a side view of a dustproof member.

FIG. 5B is a plan view and a side view of the dustproof member. The plurality of dustproof members 70 each have a sheet shape. The plurality of dustproof members 70 are formed of, for example, non-woven fabrics. The plurality of dustproof members 70 have sound permeability and prevent passage of substances that adversely affect the microphones 50, such as dust and dirt.

The rear panel 80 is a plate having a front surface 81 and a back surface 82 facing each other and having a predetermined rigidity. The rear panel 80 is, for example, a metal plate.

Components of the microphone device 10 configured as described above are arranged as shown in FIGS. 1, 2, 3A, 3B, 3C and 4.

The substrate 40 is fixed to the rear panel 80. The second surface 42 of the substrate 40 and the front surface 81 of the rear panel 80 face each other.

The plurality of microphones 50 are arranged on the second surface 42 of the substrate 40. The plurality of microphones 50 are connected to a conductor pattern formed on the substrate 40. The plurality of microphones 50 are arranged such that sound receiving surfaces face the substrate 40. The plurality of microphones 50 are arranged such that sound receiving holes overlap the holes 400 of the substrate 40 in a plan view of the microphone device 10. The plan view of the microphone device 10 refers to a state where the rear panel 80, the substrate 40, the protection member 30 and the front panel 20 are viewed from a front panel side when the components of the microphone device 10 are assembled. Hereinafter, the plan view of the microphone device 10 means the above state and is simply described as "plan view".

An opening diameter of each of the plurality of holes 400 is determined according to a specification of each of the plurality of microphones 50, for example, a diameter of the sound receiving hole. For example, the opening diameter of each of the plurality of holes 400 may be approximately equal to the opening diameter of the sound receiving hole of each of the plurality of microphones 50. Accordingly, the microphone device 10 can prevent the hole 400 of the substrate 40 from being unnecessarily large, and can prevent the sound receiving hole from being unnecessarily closed due to positional deviation when the plurality of microphones 50 are mounted on the substrate 40.

The plurality of sound insulation walls 60 are arranged on the first surface 41 of the substrate 40. One end surface of each of the plurality of sound insulation walls 60 is in contact with the first surface 41 of the substrate 40. The plurality of sound insulation walls 60 are respectively arranged in the plurality of holes 400 of the substrate 40. More specifically, each one of the plurality of sound insulation walls 60 is arranged corresponding to each one of the plurality of holes 400. At this time, the central opening of each of the plurality of sound insulation walls 60 overlaps the hole 400 of the substrate 40 in the plan view. That is, the plurality of sound insulation walls 60 are arranged so as to respectively surround the plurality of microphones 50 in the plan view.

Preferably, one end surface of each of the plurality of sound insulation walls 60 is bonded and joined to the first surface 41 of the substrate 40 by an adhesive material or the like.

An opening diameter of each of the plurality of sound insulation walls 60 is larger than the opening diameter of the hole 400 of the substrate 40. Accordingly, the microphone device 10 can prevent the holes 400 and wall portions of the plurality of sound insulation walls 60 from overlapping each other due to an error in arranging the plurality of sound insulation walls 60 on the substrate 40.

Figure 5C:
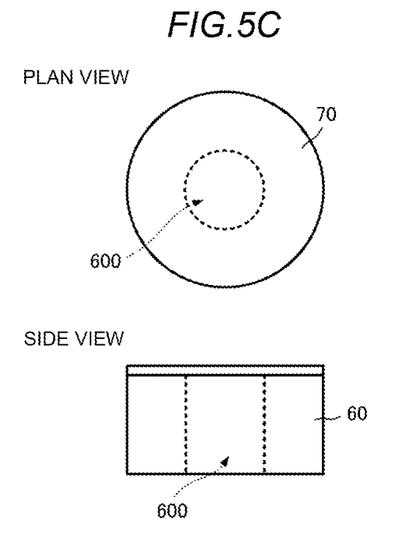
FIG. 5C is a plan view and a side view of a state where the sound insulation wall and the dustproof member are combined.

FIG. 5C is a plan view and a side view of a state where the sound insulation wall and the dustproof member are combined. As shown in FIG. 5C, each of the plurality of dustproof members 70 is attached to the other end surface of each of the plurality of sound insulation walls 60. At this time, each of the plurality of dustproof members 70 is attached so as to close the central opening of each of the plurality of sound insulation walls 60. Each one of the plurality of dustproof members 70 is arranged corresponding to each one of the plurality of sound insulation walls 60. Preferably, the plurality of dustproof members 70 are respectively bonded and joined to the plurality of sound insulation walls 60 by an adhesive material or the like.

An outer diameter of each of the plurality of dustproof members 70 may be equal to or larger than an inner diameter of the sound insulation wall 60 and may be approximately equal to an outer diameter of the sound insulation wall 60. Accordingly, the central opening of the sound insulation wall 60 can be more reliably closed by the dustproof member 70 without excessively increasing a shape of the dustproof member 70.

The protection member 30 is fixed to the rear panel 80 so as to overlap the substrate 40 in the plan view. At this time, the protection member 30 is fixed to the rear panel 80 such that the substrate 40 on which the plurality of microphones 50 are mounted, the plurality of sound insulation walls 60, and the plurality of dustproof members 70 are accommodated in the recess 300. The protection member 30 is arranged such that each of the plurality of holes 33 overlap the central opening of each of the plurality of sound insulation walls 60 in the plan view.

An opening diameter of each of the plurality of holes 33 is preferably larger than the inner diameter of each of the plurality of sound insulation walls 60 and smaller than an outer shape. Accordingly, the microphone device 10 can prevent the hole 33 from overlapping the central opening of the sound insulation wall 60 due to an installation error or the like of the plurality of sound insulation walls 60, and can prevent occurrence of a portion where the hole 33 does not overlap the sound insulation wall 60 and the dustproof member 70.

The front panel 20 has the sound permeability (acoustic transparency). The front panel 20 is realized by, for example, the mesh structure of metal, plastic or the like, a film having the sound permeability, or the like. The mesh structure also includes a so-called grill structure. The front panel 20 is fixed to the rear panel 80 by being arranged so as to overlap the protection member 30, in other words, so as to overlap the substrate 40 on which the plurality of microphones 50 are mounted, the plurality of sound insulation walls 60, and the plurality of dustproof members 70, in the plan view.

The microphone device 10 has a configuration described above to obtain the following advantageous effects.

Sound from outside of the microphone device 10 passes through the front panel 20, passes through the plurality of holes 33 of the protection member 30, passes through the plurality of dustproof members 70 and central openings of the plurality of sound insulation walls 60, passes through the plurality of holes 400 of the substrate 40, and is collected by the plurality of microphones 50. Accordingly, the microphone device 10 can collect the external sound by the plurality of microphones 50.

The dust, dirt and the like from the outside of the microphone device 10 are adsorbed by the plurality of dustproof members 70. Accordingly, the microphone device 10 can prevent the dust, dirt and the like from reaching the plurality of microphones 50.

The plurality of dustproof members 70 are not attached to the front panel 20. Therefore, the plurality of dustproof members 70 need not to be removed from the front panel 20 when the front panel 20 is repainted or the like. Accordingly, a worker or a user can easily repaint the front panel 20.

The plurality of dustproof members 70 are arranged between the protection member 30 and the plurality of sound insulation walls 60. That is, the plurality of dustproof members 70 are protected by the protection member 30. Therefore, when the front panel 20 is replaced, the worker or the user is prevented from coming into contact with the plurality of dustproof members 70, and the plurality of dustproof members 70 are prevented from being damaged.

Each of the plurality of sound insulation walls 60 is provided for each of the plurality of microphones 50. Accordingly, the microphone device 10 can prevent acoustic coupling of the plurality of microphones 50.

Particularly, in an aspect including the protection member 30, a substantially closed space is formed between the protection member 30 and the substrate 40. In such a case, if there are no plurality of sound insulation walls 60, the acoustic coupling is likely to occur due to the substantially closed space.

However, in the microphone device 10, each of the plurality of sound insulation walls 60 is arranged for each of the plurality of microphones 50. One end surface of each of the plurality of sound insulation walls 60 is in contact with the first surface 41 of the substrate 40, and the other end surface thereof abuts against the protection member 30 via each of the plurality of dustproof members 70. Accordingly, an acoustically independent space (a sound propagation path) can be formed for each of the plurality of microphones 50 in the space between the protection member 30 and the substrate 40. As a result, the microphone device 10 can more effectively prevent the acoustic coupling of the plurality of microphones 50.

The protection member 30 is preferably installed so as to press the plurality of sound insulation walls 60 against the substrate 40. In this case, if the plurality of sound insulation walls 60 are elastic members, a height of each of the plurality of sound insulation walls 60 is lower when the protection member 30 is arranged than when the protection member 30 is not arranged. In other words, a distance between the end surface of the sound insulation wall 60 on a protection member 30 side and the end surface on a substrate 40 side is short. Since the plurality of sound insulation walls 60 are elastic members, a gap between the plurality of sound insulation walls 60 and the first surface 41 of the substrate 40 is prevented by the pressing. Similarly, a gap between the protection member 30 and the plurality of dustproof members 70 is prevented. Therefore, the sound leakage in a direction parallel to the first surface 41 of the substrate 40 is further prevented, and the microphone device 10 can more effectively prevent the acoustic coupling of the plurality of microphones 50. For this reason, the plurality of sound insulation walls 60 are preferably elastic members, but may not be elastic members as long as the plurality of sound insulation walls 60 are formed of a material having sound insulation performance. The plurality of sound insulation walls 60 may have elastic members in vicinity of both end surfaces, and may have other members therebetween.

The plurality of microphones 50 are MEMS microphones. Accordingly, the microphone device 10 is thin. The plurality of microphones 50 can be easily mounted on the substrate 40, and for a configuration including many microphones 50 such as the microphone device 10, the microphone device 10 can be manufactured more easily than using microphones having another structures. For this reason, the plurality of microphones 50 are preferably MEMS microphones, but the plurality of microphones 50 may be different from the MEMS microphones.

Although not described in detail in the above description, the plurality of microphones 50 are randomly arranged. The random arrangement refers to, for example, an arrangement different from an arrangement in which the plurality of microphones 50 are arranged in a straight line or an arrangement in which the plurality of microphones 50 are arranged on a circumference having a certain diameter. In contrast to such a configuration, the microphone device 10 individually includes the plurality of sound insulation walls 60 and the plurality of dustproof members 70 respectively for the plurality of microphones 50. Therefore, the microphone device 10 can reliably arrange the plurality of sound insulation walls 60 and the plurality of dustproof members 70 respectively for the plurality of microphones 50, regardless of an arrangement pattern of the plurality of microphones 50. Shapes of the plurality of sound insulation walls 60 and the plurality of dustproof members 70 can be unified, and the plurality of sound insulation walls 60 and the plurality of dustproof members 70 can be easily manufactured and attached.

The arrangement of the plurality of microphones 50 is not random, and may be spiral, linear or polygonal. A spiral arrangement, a linear arrangement and a polygonal arrangement may be singular, plural, or a combination of many types.

The plurality of microphones 50 are, for example, an array microphone that forms a sound collection beam. When the plurality of microphones 50 are used as the array microphone, the acoustic coupling of the plurality of microphones 50 is prevented as described above, so that a desired sound collection beam can be formed more accurately. The plurality of microphones 50 may not constitute the array microphone.

Figure 6:
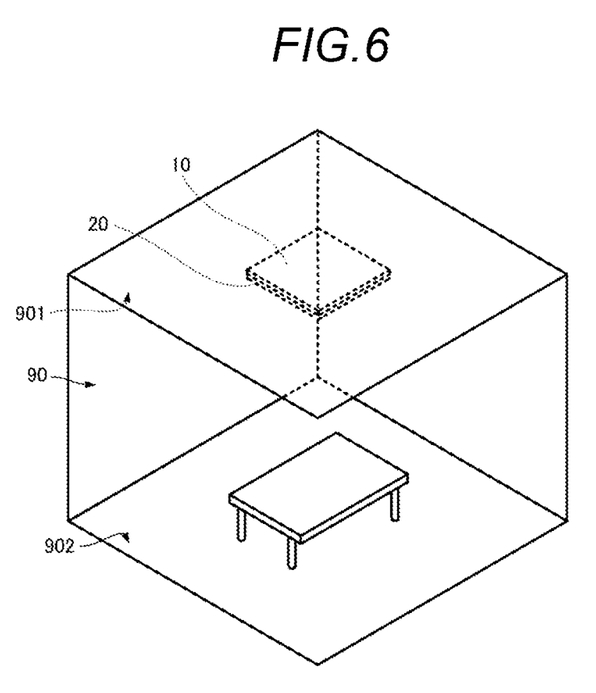
FIG. 6 is a perspective view showing an example of an installation mode of the microphone device.

The microphone device 10 having such a configuration is used, for example, as follows. FIG. 6 is a perspective view showing an example of an installation mode of the microphone device.

As shown in FIG. 6, the microphone device 10 is installed in a room 90 for a sound collection target. At this time, the microphone device 10 is installed on a ceiling 901 of the room 90. More specifically, the microphone device 10 is installed on the ceiling 901 such that the front panel 20 faces a floor 902 of the room 90. That is, the microphone device 10 is used as a so-called sealing microphone. A shape of the front panel 20 in the plan view is preferably a shape that can be replaced with a panel of the ceiling 901. For example, the shape may be adapted to a shape typically determined in countries such as the United States and Europe. This facilitates work of installing the microphone device 10 on the ceiling 901.

In such a usage mode, the user may repaint a color of the front panel 20 according to a design of the room 90. In such a case, the front panel 20 is removed, but the worker or the user can easily repaint or replace the front panel 20 by providing the configuration of the microphone device 10 as described above.

Figure 7A:
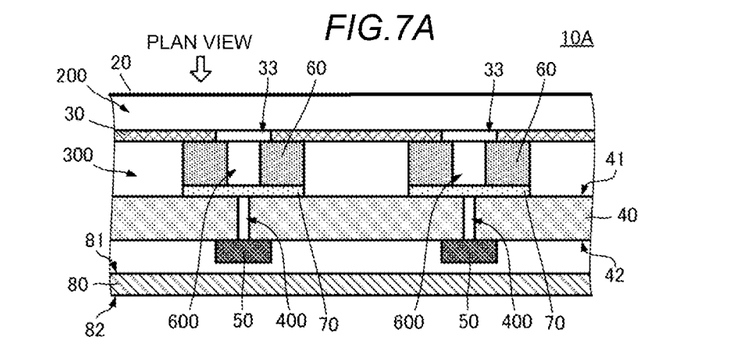
FIGS. 7A-7C are partial enlarged side views showing a configuration of a derivative example of the microphone device.
Figure 7B:
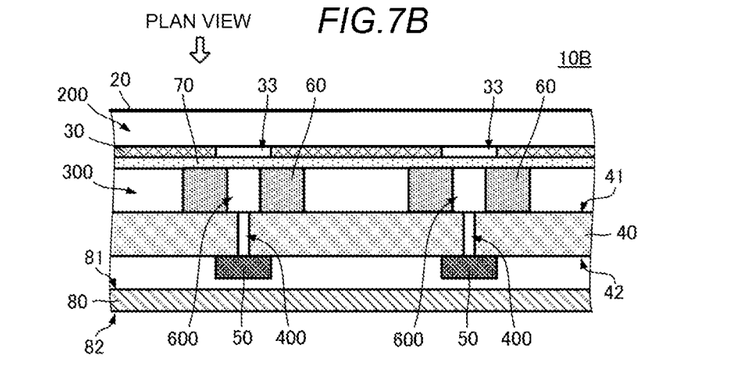
Figure 7C:
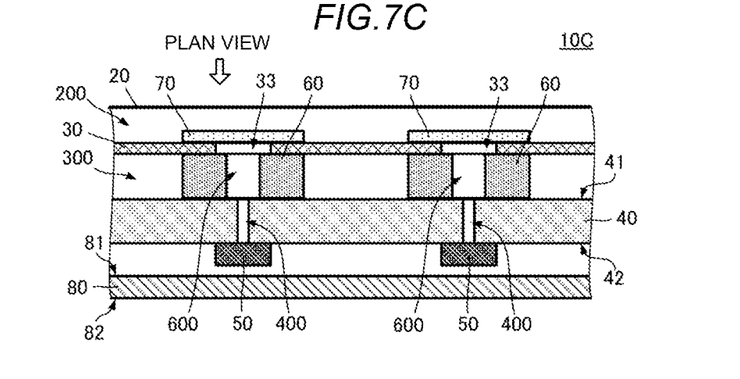

The configuration described above is an example, and for example, the microphone device may have a configuration shown in the following example. FIGS. 7A, 7B and 7C are partial enlarged side views showing the configuration of a derivative example of the microphone device.

As shown in FIG. 7A, in a microphone device 10A, a positional relationship between the plurality of sound insulation walls 60 and the plurality of dustproof members 70 is opposite to that of the microphone device 10. Other configurations of the microphone device 10A are the same as those of the microphone device 10, and description thereof will be omitted. In the microphone device 10A, the plurality of dustproof members 70 are arranged between the plurality of sound insulation walls 60 and the first surface 41 of the substrate 40.

As shown in FIG. 7B, a microphone device 10B is different from the microphone device 10 in that the dustproof member 70 common to the plurality of sound insulation walls 60 is used. Other configurations of the microphone device 10B are the same as those of the microphone device 10, and description thereof will be omitted. In the microphone device 10B, the dustproof member 70 is arranged so as to overlap the plurality of sound insulation walls 60.

As shown in FIG. 7C, a microphone device 10C is different from the microphone device 10 in that the plurality of dustproof members 70 are attached to the protection member 30. Other configurations of the microphone device 10C are the same as those of the microphone device 10, and description thereof will be omitted. In the microphone device 10C, the plurality of dustproof members 70 are arranged on a surface of the protection member 30 opposite to a contact surface thereof with the plurality of sound insulation walls 60. The plurality of dustproof members 70 are attached to the protection member 30 with, for example, an adhesive material.

In this way, in the microphone device according to the present disclosure, the dustproof member 70 may be attached to a member (a component of the microphone device) different from the front panel 20.

In the above description, the protection member 30 can be omitted except for the configuration in FIG. 7C. The plurality of sound insulation walls 60 can be omitted in that the worker or the user can easily repaint or replace the front panel 20.

The dustproof member 70 may be provided at a position other than those in the above configurations as long as the dustproof member 70 is closer to the front panel 20 than the microphone 50. The dustproof member 70 may be omitted if the above-described prevention of the acoustic coupling is a problem.

The foregoing disclosure has been set forth merely to illustrate the embodiments of the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A microphone device comprising:
    a substrate;
    a plurality of microphones arranged on the substrate;
    a front panel configured to cover the substrate on which the plurality of microphones are arranged and arranged so as to overlap the substrate, and formed with a mesh structure or a film having a sound permeability;
    a plurality of sound insulation walls arranged between the plurality of microphones and the front panel so as to not overlap the plurality of microphones in the plan view;
    a plate-shaped protection member arranged between the front panel and the substrate, and having a plurality of holes located at a central opening of each of the plurality of sound insulation walls; and
    a dustproof member arranged so as to overlap the plurality of microphones in a plan view from a front panel side, and provided on a member different from the front panel, wherein
        one end surface of each of the plurality of sound insulation walls which is arranged for each of the plurality of microphones is in contact with the substrate, and another end surface thereof abuts the protection member via each of the plurality of dustproof members, and thereby a space is formed with the protection member and the plurality of sound insulation walls and the substrate.

2. The microphone device according to claim 1, wherein the dustproof member is arranged between the front panel and the plurality of microphones.

3. The microphone device according to claim 1, wherein the plurality of sound insulation walls are arranged so as to surround the plurality of microphones in the plan view, respectively.

4. The microphone device according to claim 1, wherein each of a plurality of the dustproof members is arranged corresponding to each of end surfaces of the plurality of sound insulation walls.

5. The microphone device according to claim 1, wherein the plurality of sound insulation walls are made of an elastic member.

6. The microphone device according to claim 1, wherein the plurality of sound insulation walls are arranged between the substrate and the plate-shaped protection member, and
    wherein a distance between end surfaces of the plurality of sound insulation walls on a protection member side and end surfaces of the plurality of sound insulation walls on a substrate side is shorter when the protection member is arranged than when the protection member is not arranged.

7. The microphone device according to claim 1, wherein the plurality of microphones are randomly arranged.

8. The microphone device according to claim 1, wherein the plurality of microphones are MEMS microphones.

9. The microphone device according to claim 1, wherein the substrate and the front panel are installed on a ceiling.

10. The microphone device according to claim 9, wherein the front panel has a shape that can be replaced with a panel of the ceiling.

* * * * *